US011122656B1

(12) United States Patent
Yen et al.

(10) Patent No.: US 11,122,656 B1
(45) Date of Patent: Sep. 14, 2021

(54) APPLICATION STRUCTURE OF GALLIUM NITRIDE FIELD-EFFECT TRANSISTOR IN DIMMER CIRCUIT

(71) Applicant: GaN Power Technology Co., Ltd., Taichung (TW)

(72) Inventors: Tsung Hsien Yen, Taichung (TW); Hsing Yeh Wang, Taichung (TW); Feng Jui Shen, Taichung (TW)

(73) Assignee: Gan Power Technology Co., Ltd., Taichung (TW)

( * ) Notice: Subject to any disclaimer, the term of this patent is extended or adjusted under 35 U.S.C. 154(b) by 0 days.

(21) Appl. No.: 16/933,631

(22) Filed: Jul. 20, 2020

(51) Int. Cl.

| | |
|---|---|
| ***H05B 45/10*** | (2020.01) |
| ***H03K 17/74*** | (2006.01) |
| ***H03K 17/687*** | (2006.01) |
| ***H05B 45/34*** | (2020.01) |
| ***H05B 45/30*** | (2020.01) |
| ***H05B 45/345*** | (2020.01) |

(52) U.S. Cl.
CPC ......... *H05B 45/10* (2020.01); *H03K 17/6874* (2013.01); *H03K 17/74* (2013.01); *H05B 45/30* (2020.01); *H05B 45/34* (2020.01); *H05B 45/345* (2020.01)

(58) Field of Classification Search
CPC ........ H05B 45/10; H05B 45/30; H05B 45/34; H05B 45/345; H03K 17/6874; H03K 17/74
See application file for complete search history.

(56) References Cited

U.S. PATENT DOCUMENTS 9,198,243 B2 * 11/2015 Wu .................... H05B 45/3725
9,485,824 B2 * 11/2016 Wu ........................ H05B 45/10

* cited by examiner

*Primary Examiner* — Long Nguyen
(74) *Attorney, Agent, or Firm* — Muncy, Geissler, Olds & Lowe, P.C.

(57) ABSTRACT

An application structure of a gallium nitride field-effect transistor in a dimmer circuit is disclosed, including an LED module, a power supply circuit, a current holding circuit, and a drive circuit. The power supply circuit includes a power supply, a dimmer unit, and a rectifier circuit. The current holding circuit is electrically connected to the rectifier circuit, includes a first control switch, a capacitor capable of charging and discharging, and a plurality of resistors whose current is set, and is configured to provide a stable current to the dimmer unit. The first control switch is provided with a gallium nitride field-effect transistor. The drive circuit is electrically connected to the current holding circuit, includes a second control switch, a screen flicker prevention chip electrically connected to the LED module, and a plurality of resistors whose current is set, and is configured to stably drive the LED module to emit light. The second control switch is provided with a gallium nitride field-effect transistor.

3 Claims, 2 Drawing Sheets

APPLICATION STRUCTURE OF GALLIUM NITRIDE FIELD-EFFECT TRANSISTOR IN DIMMER CIRCUIT

FIELD OF TECHNOLOGY

The present invention relates to LED lighting equipment, and in particular, to a dimmer circuit of the LED lighting equipment.

BACKGROUND

In recent years, with development of photoelectric technologies, many novel lighting devices has been developed in the industry, among which light emitting diode (LED) lamps have attracted widespread attention. Light emitting efficiency of the LED lamps is higher than that of traditional incandescent bulbs, and photoelectric conversion efficiency is also far higher than other types of lamps. In this way, the LED lamps are in line with an energy-saving trend of the modern society.

The conventional incandescent bulb is a resistive load, and is often used with a triac dimmer, to help a user to adjust required luminance, thereby avoiding wasting electric energy. Generally speaking, the triac dimmer has a variable resistor. By adjusting a resistance value of the variable resistor, the triac dimmer is enabled to form different conduction angles, to change an output waveform to achieve a dimming effect. The triac dimmer is applicable to dimming incandescent bulbs, but is not directly applicable to light-emitting diode lamps. Reasons are as follows: The light-emitting diode lamps are not purely resistive loads, and have a considerable impedance before being conducted. When the light-emitting diode lamp is not conducted, is to be conducted, or under a low-voltage operation, the light-emitting diode lamp generates an unstable phenomenon such as flickers due to the triac dimmer absorbing a leakage current.

The forgoing unstable phenomenon such as flickers is more serious especially when a common LED driver controller on the market is used. In order to meet the energy saving trend and needs of users, it is necessary to develop a drive circuit that can be used with the triac dimmer.

SUMMARY

A main objective of the present invention is to provide a dimmer circuit that can provide a stable current and voltage, so that a light emitting diode generates no unstable phenomenon such as a flicker.

To achieve the foregoing objective, the present invention provides an application structure of a gallium nitride field-effect transistor in a dimmer circuit, including:

an LED module;

a power supply circuit, including a power supply, a dimmer unit, and a rectifier circuit that are electrically connected;

a current holding circuit, electrically connected to the rectifier circuit, including a first control switch, a capacitor capable of charging and discharging, and a plurality of resistors whose current is set, and configured to provide a stable current to the dimmer unit, where the first control switch is provided with a gallium nitride field-effect transistor; and a drive circuit, electrically connected to the current holding circuit, including a second control switch, a screen flicker prevention chip electrically connected to the LED module, and a plurality of resistors whose current is set, and configured to stably drive the LED module to emit light, where the second control switch is provided with a gallium nitride field-effect transistor.

Preferably, the first control switch and the second control switch separately include two gallium nitride field-effect transistors.

In an embodiment, the drive circuit is further electrically connected to a rectifier diode and a plurality of capacitors.

DESCRIPTION OF THE EMBODIMENTS

Figure 1:
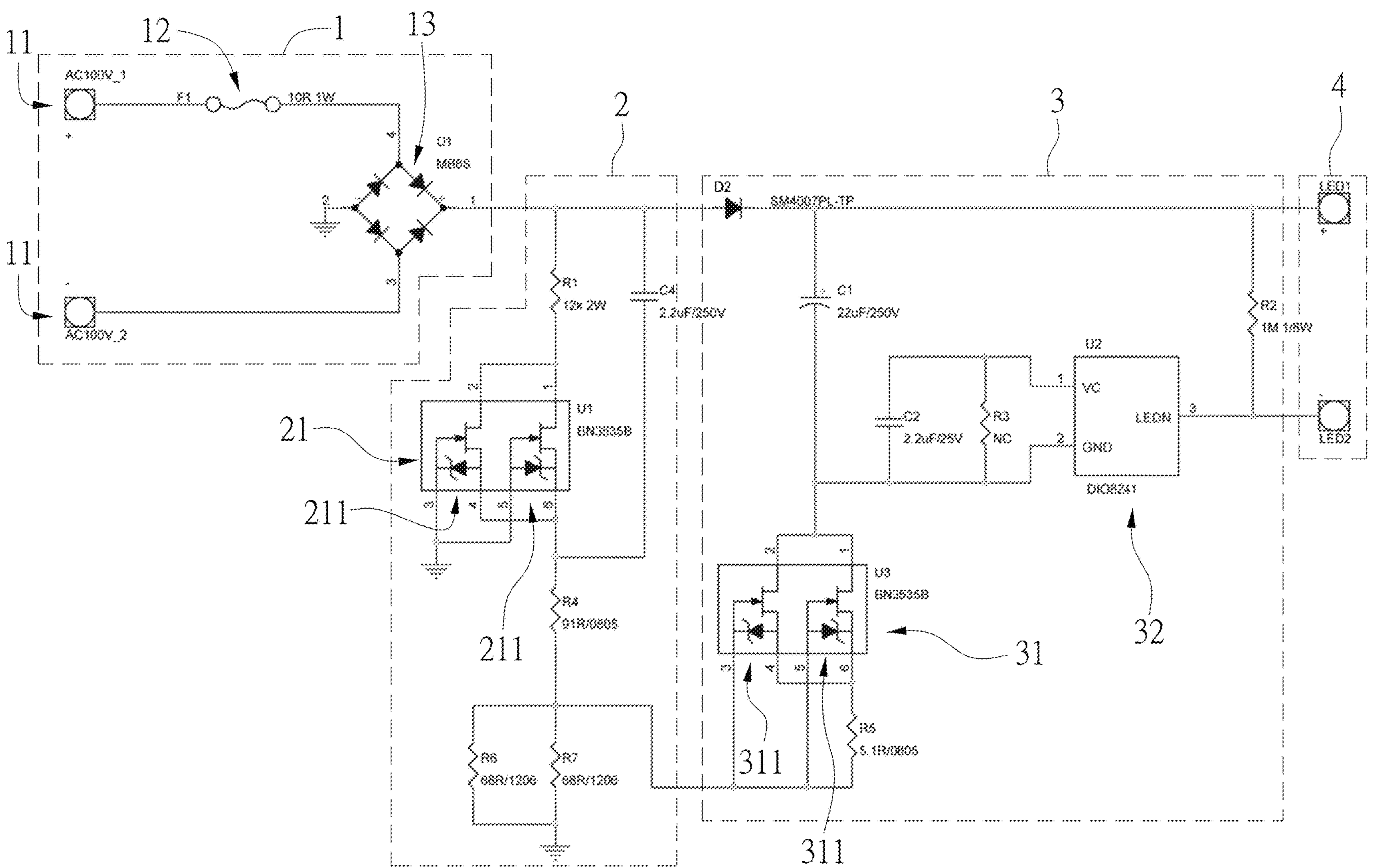
FIG. 1 is a schematic diagram of a circuit according to a first embodiment of the present invention.

FIG. 1 shows a first embodiment of an application structure of a gallium nitride field-effect transistor in a dimmer circuit according to the present invention. The application structure includes an LED module 4, a power supply circuit 1, a current holding circuit 2, and a drive circuit 3.

The power supply circuit 1 includes a power supply 11, a dimmer unit 12, and a rectifier circuit 13 that are electrically connected.

The current holding circuit 2 is electrically connected to the rectifier circuit 13, includes a first control switch 21, a capacitor C4 capable of charging and discharging, and a plurality of resistors R1, R4, R6, and R7 whose current is set, and is configured to provide a stable current to the dimmer unit 12. The first control switch 21 includes two gallium nitride field-effect transistors 211, to increase holding currents, and reduce discontinuous conduction.

The drive circuit 3 is electrically connected to the current holding circuit 2, includes a second control switch 31, a screen flicker prevention chip 32 electrically connected to the LED module 4, and a plurality of resistors R2, R3, and R5 whose current is set, and is configured to stably drive the LED module 4 to emit light. The second control switch 31 includes two gallium nitride field-effect transistors 311, to increase holding currents, and reduce discontinuous conduction.

The drive circuit 3 is further electrically connected to a rectifier diode D2 and a plurality of capacitors C1 and C2.

Based on the foregoing circuit structure, the present invention can cooperate with a triac dimmer (TRIAC dimmer) to achieve a stable current, so that the LED module emits light without flickers.

Figure 2:
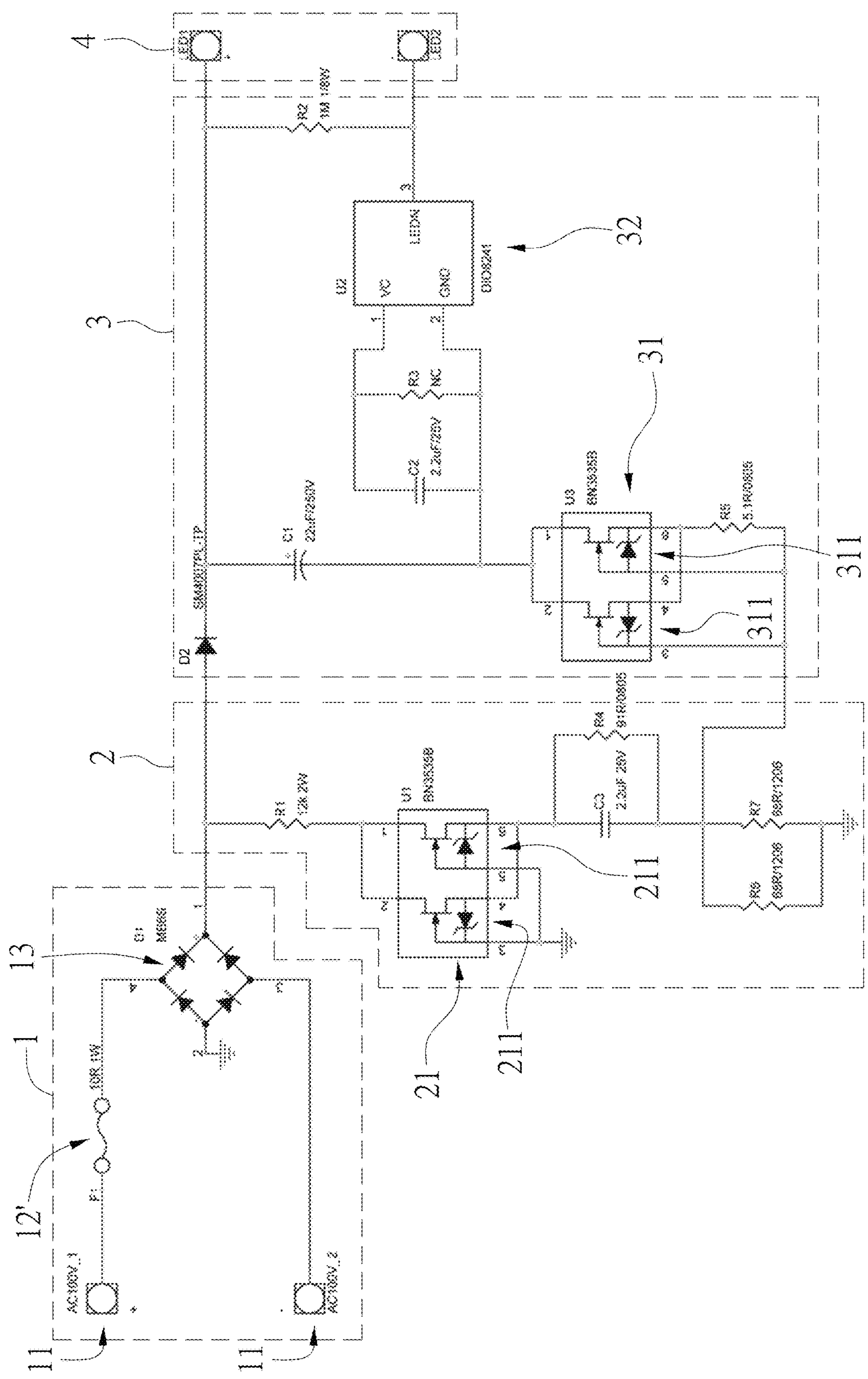
FIG. 2 is a schematic diagram of a circuit according to a second embodiment of the present invention.

Further, FIG. 2 shows a second embodiment of the present invention. Based on the circuit structure in the first embodiment, in a circuit structure in this embodiment, a position for disposing a capacitor C3 is adjusted in the current holding circuit 2, to cooperate with a different type of dimmer unit 12'. In this way, effects same as those in the first embodiment can still be achieved.

What is claimed is:

1. An application structure of a gallium nitride field-effect transistor in a dimmer circuit, comprising:

an LED module;

a power supply circuit, comprising a power supply, a dimmer unit, and a rectifier circuit that are electrically connected;

a current holding circuit, electrically connected to the rectifier circuit, comprising a first control switch, a capacitor capable of charging and discharging, and a plurality of resistors whose current is set, and configured to provide a stable current to the dimmer unit, wherein the first control switch is provided with a gallium nitride field-effect transistor; and a drive circuit, electrically connected to the current holding circuit, comprising a second control switch, a screen flicker prevention chip electrically connected to the LED module, and a plurality of resistors whose current is set, and configured to stably drive the LED module to emit light, wherein the second control switch is provided with a gallium nitride field-effect transistor.

2. The application structure of the gallium nitride field-effect transistor in the dimmer circuit according to claim 1, wherein the first control switch and the second control switch separately comprise two gallium nitride field-effect transistors.

3. The application structure of the gallium nitride field-effect transistor in the dimmer circuit according to claim 1, wherein the drive circuit is further electrically connected to a rectifier diode and a plurality of capacitors.

* * * * *